(12) United States Patent  
Sun et al.

(10) Patent No.: US 11,014,853 B2
(45) Date of Patent: May 25, 2021

(54) Y$_2$O$_3$—ZRO$_2$ EROSION RESISTANT MATERIAL FOR CHAMBER COMPONENTS IN PLASMA ENVIRONMENTS (71) Applicant: Applied Materials, Inc., Santa Clara, CA (US)

(72) Inventors: Jennifer Y. Sun, Mountain View, CA (US); David Fenwick, Los Altos Hills, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 104 days.

(21) Appl. No.: 16/279,247

(22) Filed: Feb. 19, 2019

(65) Prior Publication Data

US 2019/0276366 A1   Sep. 12, 2019

Related U.S. Application Data (60) Provisional application No. 62/639,941, filed on Mar. 7, 2018.

(51) Int. Cl.
*H01J 37/32* (2006.01)
*C04B 35/505* (2006.01)
(Continued)

(52) U.S. Cl.
CPC ...... *C04B 35/505* (2013.01); *C04B 35/62222* (2013.01); *C04B 35/638* (2013.01);
(Continued)

(58) Field of Classification Search
CPC ..... C04B 35/505; C04B 41/00; C04B 35/638; C04B 35/62222; C04B 35/645; C04B 2235/72; C04B 2235/9661; C04B 2235/77; C04B 2235/786; C04B 2235/96; C04B 2235/94; C04B 2235/95; C04B 2235/662; C04B 2235/9607; C04B 2235/3244; C04B 2235/3225; C04B 2235/612; C04B 2235/604; C04B 2235/656; C04B 2235/9669; C04B 41/009; C04B 41/5042; C04B 41/87; C04B 35/622; C04B 41/91;
(Continued)

(56) References Cited

U.S. PATENT DOCUMENTS 3,892,198 A * 7/1975 Dobson .................. C23C 14/56
                                                     118/730
4,328,294 A    5/1982 Tanaka et al.
(Continued)

FOREIGN PATENT DOCUMENTS

CN    1412150 A    4/2003
CN    1699279 A    11/2005
(Continued)

*Primary Examiner* — Rudy Zervigon
(74) *Attorney, Agent, or Firm* — Lowenstein Sandler LLP (57) ABSTRACT

A chamber component for a processing chamber comprises a ceramic body consisting of a sintered ceramic material consisting essentially of one or more phase of Y$_2$O$_3$—ZrO$_2$. The ceramic material consists essentially of 55-65 mol % Y$_2$O$_3$ and 35-45 mol % ZrO$_2$.

19 Claims, 8 Drawing Sheets

(51) Int. Cl.
| | |
|---|---|
| *C04B 35/638* | (2006.01) |
| *C04B 35/622* | (2006.01) |
| *H01L 21/67* | (2006.01) |
| *H01L 21/683* | (2006.01) |
| *C04B 35/645* | (2006.01) |
| *H01L 21/687* | (2006.01) |
| *C23C 30/00* | (2006.01) |
| *C04B 41/00* | (2006.01) |

(52) U.S. Cl.
CPC ............ *C04B 35/645* (2013.01); *C04B 41/00* (2013.01); *C23C 30/00* (2013.01); *H01J 37/32495* (2013.01); *H01J 37/32724* (2013.01); *H01L 21/67069* (2013.01); *H01L 21/67103* (2013.01); *H01L 21/6833* (2013.01); *H01L 21/68757* (2013.01); *C04B 2235/3225* (2013.01); *C04B 2235/3244* (2013.01); *C04B 2235/604* (2013.01); *C04B 2235/612* (2013.01); *C04B 2235/656* (2013.01); *C04B 2235/662* (2013.01); *C04B 2235/72* (2013.01); *C04B 2235/77* (2013.01); *C04B 2235/786* (2013.01); *C04B 2235/94* (2013.01); *C04B 2235/95* (2013.01); *C04B 2235/96* (2013.01); *C04B 2235/9607* (2013.01); *C04B 2235/9661* (2013.01); *C04B 2235/9669* (2013.01)

(58) Field of Classification Search
CPC ..... C04B 41/80; C04B 41/53; C04B 41/0072; H01L 21/68757; H01L 21/67069; H01L 21/67103; H01L 21/6833; C23C 30/00; H01J 37/32495; H01J 37/32724; H01J 37/32467; H01J 2237/334; H01J 2237/335
USPC ............ 118/715; 156/345.1, 345.33, 345.34
See application file for complete search history.

(56) References Cited

U.S. PATENT DOCUMENTS

| | | | |
|---|---|---|---|
| 4,328,295 A | 5/1982 | Tanaka et al. | |
| 4,360,598 A | 11/1982 | Otagiri et al. | |
| 4,370,393 A | 1/1983 | Watanabe et al. | |
| 4,645,716 A | 2/1987 | Harrington et al. | |
| 5,879,523 A | 3/1999 | Wang et al. | |
| 5,900,283 A | 5/1999 | Vakil et al. | |
| 5,968,377 A * | 10/1999 | Yuasa | H01J 37/32018 219/121.41 |
| 5,993,976 A | 11/1999 | Sahoo et al. | |
| 6,069,103 A | 5/2000 | Kwon | |
| 6,645,585 B2 | 11/2003 | Ozono | |
| 6,730,422 B2 | 5/2004 | Litton et al. | |
| 6,933,254 B2 | 8/2005 | Morita et al. | |
| 7,148,167 B2 | 12/2006 | Shikata et al. | |
| 7,186,466 B2 | 3/2007 | Zhu et al. | |
| 7,220,497 B2 | 5/2007 | Chang | |
| 7,291,408 B2 | 11/2007 | Litton et al. | |
| 8,021,762 B2 | 9/2011 | Taylor et al. | |
| 8,034,734 B2 | 10/2011 | Sun et al. | |
| 8,367,227 B2 * | 2/2013 | Sun | C04B 35/505 428/702 |
| 8,623,527 B2 | 1/2014 | Sun et al. | |
| 8,728,967 B2 | 5/2014 | Taylor et al. | |
| 8,871,312 B2 * | 10/2014 | Sun | C04B 35/505 427/569 |
| 9,440,886 B2 * | 9/2016 | Sun | C04B 35/62655 |
| 9,617,188 B2 * | 4/2017 | Sun | C04B 37/001 |
| 9,725,799 B2 * | 8/2017 | Sun | C04B 41/009 |
| 9,797,037 B2 * | 10/2017 | Sun | C04B 35/505 |
| 9,884,787 B2 * | 2/2018 | Sun | C04B 35/62222 |
| 9,890,086 B2 * | 2/2018 | Sun | H01L 21/6833 |
| 10,385,459 B2 * | 8/2019 | Sun | C23C 28/042 |
| 10,443,125 B2 * | 10/2019 | Wu | C23C 28/42 |
| 10,563,303 B2 * | 2/2020 | Wu | C23C 4/18 |
| 10,577,286 B2 * | 3/2020 | Sun | H01L 21/68757 |
| 10,584,068 B2 * | 3/2020 | Sun | C23C 16/50 |
| 2002/0009560 A1 | 1/2002 | Ozono | |
| 2002/0018921 A1 | 2/2002 | Yamada et al. | |
| 2003/0215643 A1 | 11/2003 | Morita et al. | |
| 2003/0215665 A1 | 11/2003 | Bruce et al. | |
| 2003/0215996 A1 | 11/2003 | Putkonen | |
| 2004/0023047 A1 | 2/2004 | ODonnell et al. | |
| 2004/0038085 A1 | 2/2004 | Litton et al. | |
| 2004/0038086 A1 | 2/2004 | Litton et al. | |
| 2004/0159984 A1 | 8/2004 | Isomura et al. | |
| 2005/0037193 A1 | 2/2005 | Sun et al. | |
| 2005/0065012 A1 | 3/2005 | Rosenflanz et al. | |
| 2007/0197368 A1 | 8/2007 | Tsukuma et al. | |
| 2007/0237971 A1 | 10/2007 | Saint-Ramond et al. | |
| 2008/0264564 A1 | 10/2008 | Sun et al. | |
| 2008/0264565 A1 | 10/2008 | Sun et al. | |
| 2009/0036292 A1 * | 2/2009 | Sun | C04B 35/505 501/134 |
| 2009/0214825 A1 | 8/2009 | Sun et al. | |
| 2010/0160143 A1 | 6/2010 | Sun et al. | |
| 2010/0272982 A1 | 10/2010 | Dickinson et al. | |
| 2012/0034469 A1 | 2/2012 | Sun et al. | |
| 2013/0022838 A1 * | 1/2013 | Sun | C04B 35/486 428/697 |
| 2013/0295326 A1 | 11/2013 | Doesburg et al. | |
| 2015/0133285 A1 * | 5/2015 | Sun | H01L 21/6833 501/103 |
| 2015/0143677 A1 | 5/2015 | Sun et al. | |
| 2015/0329430 A1 * | 11/2015 | Sun | B32B 9/048 428/446 |
| 2016/0318807 A1 * | 11/2016 | Sun | C04B 35/62655 |
| 2016/0326060 A1 * | 11/2016 | Sun | H01L 21/6833 |
| 2016/0326061 A1 * | 11/2016 | Sun | C23C 16/45525 |
| 2017/0110293 A1 | 4/2017 | Sun et al. | |
| 2017/0365444 A1 * | 12/2017 | Kim | H01J 7/32449 |
| 2018/0044246 A1 * | 2/2018 | Sun | C04B 35/62222 |
| 2018/0044247 A1 * | 2/2018 | Sun | H01L 21/67069 |
| 2018/0251406 A1 * | 9/2018 | Sun | C04B 35/505 |
| 2018/0327892 A1 * | 11/2018 | Wu | C23C 16/28 |
| 2018/0327898 A1 * | 11/2018 | Wu | C23C 16/4404 |
| 2018/0327899 A1 * | 11/2018 | Wu | C23C 16/403 |
| 2018/0337026 A1 * | 11/2018 | Firouzdor | H01J 37/32724 |
| 2019/0263722 A1 * | 8/2019 | Sun | C04B 35/505 |
| 2019/0276366 A1 * | 9/2019 | Sun | C04B 41/009 |
| 2020/0140996 A1 * | 5/2020 | Wu | C23C 16/56 |

FOREIGN PATENT DOCUMENTS

| | | |
|---|---|---|
| EP | 1158072 A2 | 11/2001 |
| EP | 1310466 A2 | 5/2003 |
| JP | 2000001362 A | 1/2000 |
| JP | 2001181042 A | 7/2001 |
| JP | 2002087878 A | 3/2002 |
| JP | H665706 | 5/2003 |
| JP | 2003238250 A | 8/2003 |
| JP | 2004269951 A | 9/2004 |
| JP | 2006089338 A | 4/2006 |

\* cited by examiner

Y$_2$O$_3$—ZRO$_2$ EROSION RESISTANT MATERIAL FOR CHAMBER COMPONENTS IN PLASMA ENVIRONMENTS

RELATED APPLICATIONS

This patent application claims the benefit under 35 U.S.C. § 119(e) of U.S. Provisional Application No. 62/639,941, filed Mar. 7, 2018.

TECHNICAL FIELD

Embodiments of the present disclosure relate, in general, to an erosion resistant ceramic material composed of $Y_2O_3$ and $ZrO_2$, and in particular to chamber components manufactured from such an erosion resistant ceramic material.

BACKGROUND

In the semiconductor industry, devices are fabricated by a number of manufacturing processes producing structures of an ever-decreasing size. Some manufacturing processes such as plasma etch and plasma clean processes expose a substrate to a high-speed stream of plasma to etch or clean the substrate. The plasma may be highly corrosive, and may corrode processing chambers and other surfaces that are exposed to the plasma.

SUMMARY

In one embodiment, a chamber component for a processing chamber (e.g., for a semiconductor processing chamber) comprises a ceramic body consisting of a sintered ceramic material consisting essentially of $Y_2O_3$—$ZrO_2$, wherein the ceramic material consists essentially of 55-65 mol % $Y_2O_3$ and 35-45 mol % $ZrO_2$.

In one embodiment, a chamber component for a processing chamber comprises a body and a ceramic coating on the body. The body comprises at least one of a sintered ceramic material or a metal. The ceramic coating consists essentially of one or more phase of $Y_2O_3$—$ZrO_2$, wherein the ceramic coating consists essentially of 55-65 mol % $Y_2O_3$ and 35-45 mol % $ZrO_2$.

In one embodiment, a method of manufacturing a chamber component for a processing chamber may be performed. The method includes mixing a $Y_2O_3$ powder with a $ZrO_2$ powder to form a $Y_2O_3$—$ZrO_2$ powder consisting essentially of 55-65 mol % $Y_2O_3$ and 35-45 mol % $ZrO_2$. The method further includes performing cold isostatic pressing using the $Y_2O_3$—$ZrO_2$ powder to form a green body. The method further includes forming the green body into an approximate shape of the chamber component. The method further includes performing a first heat treatment on the green body to burn off an organic binder in the green body. The method further includes subsequently performing a second heat treatment on the green body at a temperature of about 1750-1900° C. to sinter the green body and produce a sintered ceramic body consisting essentially of one or more phase of $Y_2O_3$—$ZrO_2$, wherein the sintered ceramic body consists essentially of 55-65 mol % $Y_2O_3$ and 35-45 mol % $ZrO_2$. The method further includes machining the sintered ceramic body. The method further includes performing a purification process on the sintered ceramic body to remove trace metals from the sintered ceramic body.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments of the present disclosure provide various chamber components for a processing chamber that are composed of $Y_2O_3$—$ZrO_2$ that includes 55-65 mol % $Y_2O_3$ and 35-45 mol % $ZrO_2$. The chamber components may be or include solid sintered ceramic bodies composed of the $Y_2O_3$—$ZrO_2$ that includes 55-65 mol % $Y_2O_3$ and 35-45 mol % $ZrO_2$. Examples of chamber components that may benefit from use of the disclosed solid sintered ceramic bodies include nozzles, gas delivery plates, chamber doors, rings, lids, electrostatic chucks, heater substrate supports, and so on. Use of the $Y_2O_3$—$ZrO_2$ that includes 55-65 mol % $Y_2O_3$ and 35-45 mol % $ZrO_2$ to form the chamber components provides advantages over chamber components composed of other ceramic materials, including advantages over chamber components composed of approximately 70% $Y_2O_3$ and approximately 30 mol % $ZrO_2$ in some applications. Such advantages include increased hardness, increased tensile strength and/or increased wear resistance.

The term "heat treating" is used herein to mean applying an elevated temperature to a ceramic article, such as by a furnace. "Plasma resistant material" refers to a material that is resistant to erosion and corrosion due to exposure to plasma processing conditions. The plasma processing conditions include a plasma generated from halogen-containing gases, such as $C_2F_6$, $SF_6$, $SiCl_4$, HBR, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. The resistance of the material to plasma is measured through "etch rate" (ER), which may have units of Angstrom/min (A/min), throughout the duration of the coated components' operation and exposure to plasma. Plasma resistance may also be measured through an erosion rate having the units of nanometer/radio frequency hour (nm/RFHr), where one RFHr represents one hour of processing in plasma processing conditions. Measurements may be taken after different processing times. For example, measurements may be taken before processing, after 50 processing hours, after 150 processing hours, after 200 processing hours, and so on. An erosion rate lower than about 100 nm/RFHr is typical for a plasma resistant coating material. A single plasma resistant material may have multiple different plasma resistance or erosion rate values. For example, a plasma resistant material may have a first plasma resistance or erosion rate associated with a first type of plasma and a second plasma resistance or erosion rate associated with a second type of plasma.

When the terms "about" and "approximately" are used herein, these are intended to mean that the nominal value presented is precise within ±10%. Nominal value may also be precise to within +/−2% in embodiments. Some embodiments are described herein with reference to chamber components and other articles installed in plasma etchers for semiconductor manufacturing. However, it should be understood that such plasma etchers may also be used to manufacture micro-electro-mechanical systems (MEMS)) devices. Additionally, the articles described herein may be other structures that are exposed to plasma or other corrosive environments. Articles discussed herein may be chamber components for processing chambers such as semiconductor processing chambers.

Embodiments are discussed herein with reference to chamber components that are formed of bulk sintered ceramic bodies and properties are provided for such bulk sintered ceramic bodies. However, it should be noted that in some embodiments chamber components may be composed of different metals and/or ceramics than the described ceramic material consisting of one or more phase of $Y_2O_3$—$ZrO_2$ and may have a coating that consists of the ceramic material consisting of $Y_2O_3$—$ZrO_2$ with 55-65 mol % $Y_2O_3$ and 35-45 mol % $ZrO_2$. The coating may be formed via a sol-gel coating technique, a thermal spray coating technique such as plasma spraying, an ion assisted deposition (IAD) technique, a physical vapor deposition (PVD) technique, a chemical vapor deposition (CVD) technique and/or an atomic layer deposition (ALD) technique. Accordingly, the chamber components discussed herein as being solid ceramic articles composed of $Y_2O_3$—$ZrO_2$ may alternatively be $Al_2O_3$, AlN, $Y_2O_3$, or other materials that are coated by a coating of the ceramic material composed of $Y_2O_3$—$ZrO_2$. Coating properties may be similar to bulk sintered ceramic properties for the ceramic material consisting of one or more phase of $Y_2O_3$—$ZrO_2$ for coatings formed via IAD, PVD, CVD and/or ALD.

Figure 1:
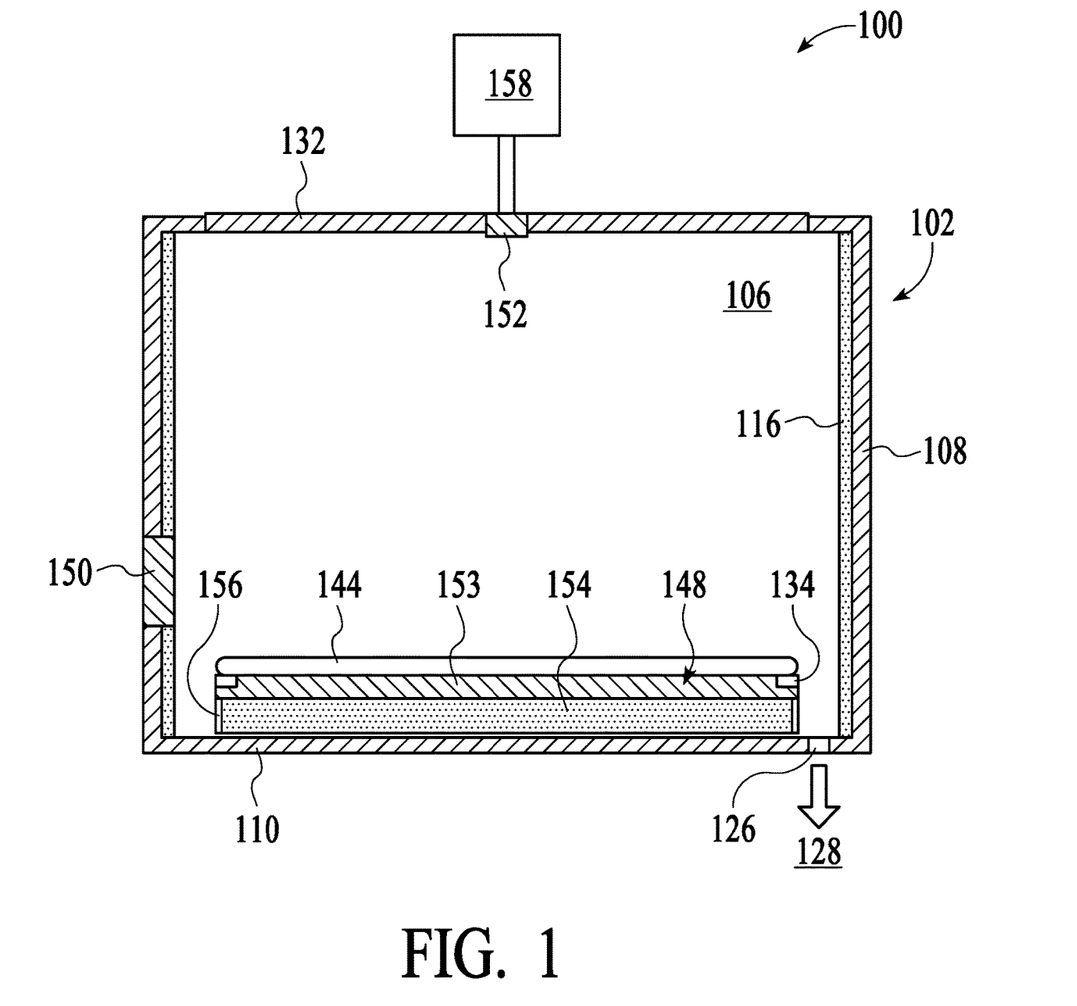
FIG. 1 depicts a sectional view of one embodiment of a processing chamber.

FIG. 1 is a sectional view of a processing chamber 100 (e.g., a semiconductor processing chamber) having one or more chamber components that include a plasma resistant ceramic material that consists essentially of one or more phase of $Y_2O_3$—$ZrO_2$, wherein the ceramic material consists essentially of 55-65 mol % $Y_2O_3$ and 35-45 mol % $ZrO_2$ in accordance with embodiments of the present disclosure. In a further embodiment, the ceramic material consists essentially of 56-65 mol % $Y_2O_3$ and 35-44 mol % $ZrO_2$. In a further embodiment, the ceramic material consists essentially of 57-65 mol % $Y_2O_3$ and 35-43 mol % $ZrO_2$. In a further embodiment, the ceramic material consists essentially of 58-65 mol % $Y_2O_3$ and 35-42 mol % $ZrO_2$. In a further embodiment, the ceramic material consists essentially of 59-65 mol % $Y_2O_3$ and 35-41 mol % $ZrO_2$. In a further embodiment, the ceramic material consists essentially of 60-65 mol % $Y_2O_3$ and 35-40 mol % $ZrO_2$. In a further embodiment, the ceramic material consists essentially of 55-64 mol % $Y_2O_3$ and 36-45 mol % $ZrO_2$. In a further embodiment, the ceramic material consists essentially of 55-63 mol % $Y_2O_3$ and 37-45 mol % $ZrO_2$. In a further embodiment, the ceramic material consists essentially of 55-62 mol % $Y_2O_3$ and 38-45 mol % $ZrO_2$. In a further embodiment, the ceramic material consists essentially of 55-61 mol % $Y_2O_3$ and 39-45 mol % $ZrO_2$. In a further embodiment, the ceramic material consists essentially of 55-60 mol % $Y_2O_3$ and 40-45 mol % $ZrO_2$. In a further embodiment, the ceramic material consists essentially of 56-64 mol % $Y_2O_3$ and 36-44 mol % $ZrO_2$. In a further embodiment, the ceramic material consists essentially of 57-63 mol % $Y_2O_3$ and 37-43 mol % $ZrO_2$. In a further embodiment, the ceramic material consists essentially of 58-62 mol % $Y_2O_3$ and 36-42 mol % $ZrO_2$. In a further embodiment, the ceramic material consists essentially of 59-61 mol % $Y_2O_3$ and 39-41 mol % $ZrO_2$. In a further embodiment, the ceramic material consists essentially of about 60 mol % $Y_2O_3$ and about 40 mol % $ZrO_2$. The sintered ceramic body composed of the ceramic material of $Y_2O_3$—$ZrO_2$ may have a porosity of about 0.1%, where the porosity is the pore-volume fraction.

The processing chamber 100 may be used for processes in which a corrosive plasma environment is provided. For example, the processing chamber 100 may be a chamber for a plasma etch reactor (also known as a plasma etcher), a plasma cleaner, and so forth. Examples of chamber components that may include or be formed of the ceramic material consisting essentially of $Y_2O_3$—$ZrO_2$ are a lid 132, a nozzle 152, a chamber door 150, a puck 153 of an electrostatic chuck (ESC) 148, a ring (e.g., a process kit ring or single ring) 134, a gas distribution plate (not shown), a heater substrate support (not shown), and so on. Each of these chamber components may benefit from use of the ceramic material that consists essentially of $Y_2O_3$—$ZrO_2$ for one or more reasons. For example, a ceramic material of $Y_2O_3$—$ZrO_2$ that comprises 55-60 mol % $Y_2O_3$ and 40-45 mol % $ZrO_2$, 56-64 mol % $Y_2O_3$ and 36-44 mol % $ZrO_2$, 57-63 mol % $Y_2O_3$ and 37-43 mol % $ZrO_2$, 58-62 mol % $Y_2O_3$ and 36-42 mol % $ZrO_2$, 59-61 mol % $Y_2O_3$ and 39-41 mol % $ZrO_2$, or about 60 mol % $Y_2O_3$ and about 40 mol % $ZrO_2$ may have an optimal or close to optimal combination of hardness, erosion resistance, dielectric breakdown resistance, and/or tensile strength as compared to other ceramic materials (including $Y_2O_3$—$ZrO_2$ that comprises greater than 65 mol % $Y_2O_3$ and less than 35 mol % $ZrO_2$, as well as $Y_2O_3$—$ZrO_2$ that comprises less than 55 mol % $Y_2O_3$ and greater than 45 mol % $ZrO_2$).

Table 1 below provides properties of various bulk sintered ceramic materials that include mixtures of $Y_2O_3$ and $ZrO_2$ at various concentrations. In the table, sample A includes 100 mol % $Y_2O_3$, sample B includes 73.2 mol % $Y_2O_3$ and 26.8 mol % $ZrO_2$, sample C includes 64.5 mol % $Y_2O_3$ and 35.5 mol % $ZrO_2$, sample D includes 60.3 mol % $Y_2O_3$ and 39.7 mol % $ZrO_2$, and sample E includes 57.7 mol % $Y_2O_3$ and 42.3 mol % $ZrO_2$. As shown, optimal properties for some applications are achieved using 60.3 mol % $Y_2O_3$ and 39.7 mol % $ZrO_2$. For example, the ceramic material consisting essentially of 60.3 mol % $Y_2O_3$ and 39.7 mol % $ZrO_2$ exhibits the highest average flexural strength, the highest Viker hardness and the highest fracture toughness of the tested compositions, while also exhibiting high modulus of elasticity, density, dielectric breakdown resistance of about 500-600 V/mil and plasma erosion resistance. Similar desirable properties are also achieved using 59-61 mol % $Y_2O_3$ and 39-41 mol % $ZrO_2$, 58-62 mol % $Y_2O_3$ and 36-42 mol % $ZrO_2$, 57-63 mol % $Y_2O_3$ and 37-43 mol % $ZrO_2$, and so on, with the combination of properties of the ceramic material becoming less desirable for the applications the further the ceramic material deviates from 60.3 mol % $Y_2O_3$ and 39.7 mol % $ZrO_2$. The thermal shock resistivity coefficient (R') is computed using the following formula:

$$R' = \frac{\text{Thermal conductivity} \times \text{average flexural strength} \times (1 - \text{Poisson's ratio})}{\text{Modulus of elasticity} \times \text{Thermal expansion coefficient}}$$

TABLE 1

Properties of Sintered Ceramic Articles

| Property | Units | A | B | C | D | E |
|---|---|---|---|---|---|---|
| $Y_2O_3$ | mol % | 100 | 73.2 | 64.5 | 60.3 | 57.7 |
| $ZrO_2$ | mol % | 0 | 26.8 | 35.5 | 39.7 | 42.3 |
| Avg. Flexural Strength | MPa | 110 | 124.6 | 139.4 | 150 | 140 |
| Modulus of Elasticity | GPa | 170 | 190 | 196 | 195 | |
| Viker 5 Kgf Hardness | GPa | 6 | 9.4 | 9.1 | 9.4 | |
| Poisson's Ratio | v | | 0.304 | 0.294 | 0.293 | |
| Fracture Toughness | $MPa \cdot m^{1/2}$ | 1.2 | 1.2 | 1.2 | 1.3 | |
| Thermal Expansion Coefficient (at 20-900° C.) | $\times 10^{-6}/K$ | 8.2 | 9.1 | 9.4 | 9.5 | 9.6 |
| Thermal Conductivity (at 20° C.) | W/mK | 14 | 4.6 | 4.1 | 3.7 | 3.5 |
| Volumetric Resistivity (at 20° C.) | Ohm · cm | $\times E^{16}$ | | | | |
| Dielectric Constant (13.56 MHz) | — | | 12.5 | | | |
| Tans δ | — | | <0.001 | | | |
| Density | g/cm³ | 4.92 | 5.1 | 5.22 | 5.25 | 5.26 |
| Avg. Grain Size | μm | 25 | | | | |
| Thermal Shock Resistivity Coefficient (R') | — | | 0.751 | 0.234 | 0.219 | 0.241 |

In one embodiment, the processing chamber 100 includes a chamber body 102 and a lid 132 that enclose an interior volume 106. The lid 132 may include a through hole at approximately a center of the lid 132 that receives a nozzle 152. The chamber body 102 may be fabricated from aluminum, stainless steel or other suitable material. The chamber body 102 generally includes sidewalls 108 and a bottom 110.

An outer liner 116 may be disposed adjacent the sidewalls 108 to protect the chamber body 102. The outer liner 116 may be a halogen-containing gas resist material such as $Al_2O_3$ or $Y_2O_3$.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 132 may be supported on the sidewalls 108 of the chamber body 102 and/or on a top portion of the chamber body. The lid 132 may provide a seal for the processing chamber 100. The lid 132 may be opened to allow access to the interior volume 106 of the processing chamber 100 in some embodiments. A gas panel 158 may be coupled to the processing chamber 100 to provide process and/or cleaning gases to the interior volume 106 through gas delivery holes in the nozzle 152. Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases).

A substrate support assembly such as an electrostatic chuck 148 or a heater substrate support (not shown) is disposed in the interior volume 106 of the processing chamber 100 below the lid 132 and nozzle 152. The electrostatic chuck 148 holds a substrate 144 (e.g., a semiconductor wafer) during processing. The electrostatic chuck 148 may secure the substrate 144 during processing, and may include an electrostatic puck 153 bonded to a thermally conductive (e.g., metal) base 154 (also referred to as a thermally conductive plate) and/or one or more additional components. The thermally conductive base 154 may be composed of Al. In embodiments, an outer wall of the thermally conductive base 154 includes an anodization layer 156 (e.g., an $Al_2O_3$ anodization layer). A ring 134 such as a process kit ring may be disposed on the electrostatic chuck at an outer perimeter of the electrostatic puck 153 in embodiments.

The chamber body 102 may include a cavity in a sidewall of the chamber body 102. The cavity may be covered by a chamber door 150 in embodiments. The interior body 106 may be filled with plasma during processing and/or cleaning. The cavity may cause a non-uniformity in a radio frequency (RF) field that is produced in the chamber body 102 to accelerate the plasma. The non-uniformity can cause arcing and an increase in plasma intensity at the cavity. The chamber door 150 may be composed of the ceramic material consisting essentially of $Y_2O_3$—$ZrO_2$ with 55-65 mol5 $Y_2O_3$ and 35-45 mol % $ZrO_2$, which provides a high resistance to the plasma in the interior volume 106 and also has a high dielectric breakdown resistance. The high dielectric breakdown resistance may eliminate or reduce any non-uniformity in the RF field, and may eliminate and/or suppress arcing. The ceramic material consisting essentially of $Y_2O_3$—$ZrO_2$ with 55-65 mol5 $Y_2O_3$ and 35-45 mol % $ZrO_2$ also has a high flexural strength, which mitigates or eliminates breakage of the chamber door 150. The ceramic material consisting essentially of $Y_2O_3$—$ZrO_2$ with 55-65 mol5 $Y_2O_3$ and 35-45 mol % $ZrO_2$ also has a high hardness, which reduces wear on the chamber door 150. In one embodiment, the chamber door 150 is a curved flip up door that includes a metal component attached to a ceramic body, where the metal component includes and/or is attached to a hinge mechanism. In one embodiment, the chamber door has a thickness of about 0.5-1.5 inches, a first dimension (e.g., length) of about 3-6 inches (e.g., about 4-5 inches) and a second dimension (e.g., a height) of about 8-16 inches (e.g., about 10-14 inches).

Figure 2:
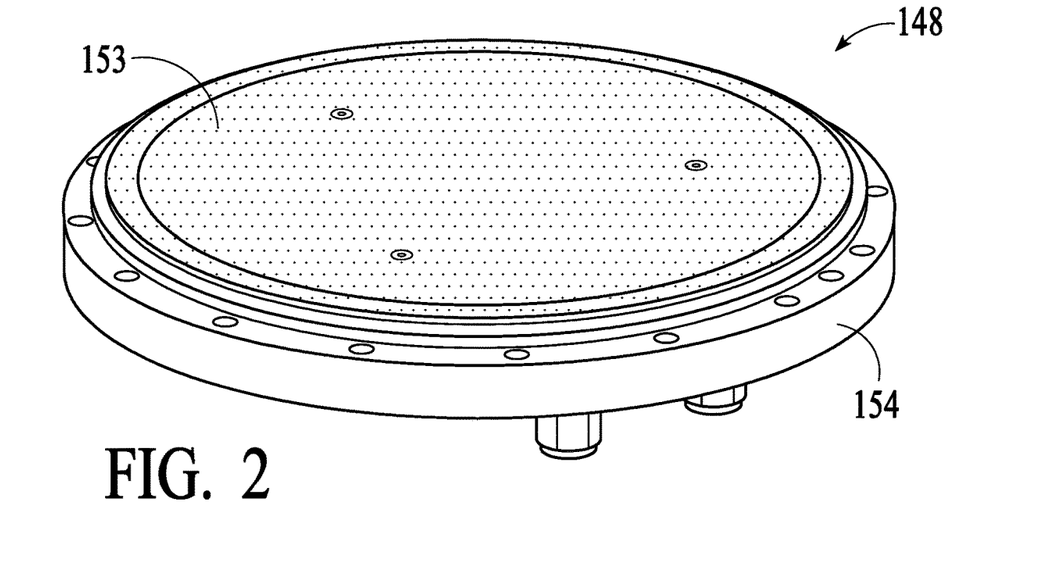
FIG. 2 depicts one embodiment of an electrostatic chuck assembly.

FIG. 2 depicts an exploded view of one embodiment of the electrostatic chuck 148. The electrostatic chuck 148 includes the electrostatic puck 153 bonded to the thermally conductive base 154. The electrostatic puck 153 has a disc-like shape having an annular periphery that may substantially match the shape and size of the substrate 144 positioned thereon. The electrostatic puck 153 may include one or more embedded heating elements and/or one or more embedded chucking electrodes. The heating elements may be configured to heat supported substrates to temperatures of up to about 350° C. in some embodiments. The electrostatic puck 153 may additionally include mesas on a surface of the electrostatic puck 153 and one or more gas delivery holes for delivering a heat conducting gas (e.g., He) between a surface of the electrostatic puck and a backside of a supported substrate.

In one embodiment, the electrostatic puck 166 may be a sintered ceramic body fabricated by the ceramic material consisting essentially of $Y_2O_3$—$ZrO_2$. The electrostatic puck 166 may have a thickness of 0.04-0.25 and a diameter of 7.85-12.90 in some embodiments. In one embodiment, the electrostatic puck 153 includes a first ceramic body formed of the ceramic material consisting essentially of $Y_2O_3$—$ZrO_2$ with 55-65 mol5 $Y_2O_3$ and 35-45 mol % $ZrO_2$ bonded to a second ceramic body consisting essentially of AlN or $Al_2O_3$. Use of the ceramic material consisting essentially of $Y_2O_3$—$ZrO_2$ with 55-65 mol5 $Y_2O_3$ and 35-45 mol % $ZrO_2$ (e.g., with about 60 mol % $Y_2O_3$ and about 40 mol % $ZrO_2$ provides an optimal or near optimal combination of dielectric breakdown resistance, plasma erosion resistance and hardness for the electrostatic puck 153. The dielectric breakdown resistance and resistivity can be useful properties of the electrostatic puck 153 for both Coulombic and Johnsen-Rahbek (JR) electrostatic chucks. Additionally, the erosion resistance should be high to minimize particle contamination and maximize the life of the ESC 148. Moreover, the electrostatic puck 153 makes physical contact with many substrates during use, which causes wear on the electrostatic puck 153. The high hardness of 9.4 GPa resists wear (e.g., due to relative motion because of coefficient of thermal expansion mismatch between the supported substrate & the electrostatic puck 153) during processing of the substrate or wafer. The high hardness of the ceramic material consisting essentially of $Y_2O_3$—$ZrO_2$ with about 55-65 mol % $Y_2O_3$ and about 35-45 mol % $ZrO_2$ minimizes such wear.

The thermally conductive base 154 attached below the electrostatic puck 153 may have a disc-like body. The thermally conductive base 154 may be fabricated by a material having thermal properties substantially matching that of the overlying electrostatic puck 153 in some embodiments. In one embodiment, the thermally conductive base 154 may be fabricated by a metal, such as aluminum or stainless steel or other suitable materials. Alternatively, the thermally conductive base 154 may be fabricated by a composite of ceramic and metal material providing good strength and durability as well as heat transfer properties. The composite material may have a thermal expansion coefficient that is substantially matched to the overlying electrostatic puck 153 to reduce thermal expansion mismatch in some embodiments.

The thermally conductive base 154 may be bonded to the electrostatic puck 153 by a silicone bond in embodiments. In some embodiments, the electrostatic puck 153 is formed from a first ceramic body of AlN or $Al_2O_3$. AlN may be used for Johnson-Rahbek electrostatic chucks and $A_2O_3$ may be used for coulumbic electrostatic chucks. The first ceramic body may include one or more chucking electrodes and/or one or more heating electrodes embedded therein. A second ceramic body (e.g., a thin wafer) formed from $Y_2O_3$—$ZrO_2$ with about 55-65 mol % $Y_2O_3$ and about 35-45 mol % $ZrO_2$ may be bonded to the first ceramic body by a diffusion bond. The diffusion bonding may be performed using a temperature of about 120-130° C. and a pressure of up to about 300 pounds per square inch (PSI).

For the diffusion bond between the first ceramic body (of AlN or $Al_2O_3$) and the second ceramic body (formed from $Y_2O_3$—$ZrO_2$ with about 55-65 mol % $Y_2O_3$ and about 35-45 mol % $ZrO_2$), an interface layer may be formed between the first ceramic body and the second ceramic body. The interface layer may be composed of Y, Zr, Al and O.

Figure 3A:
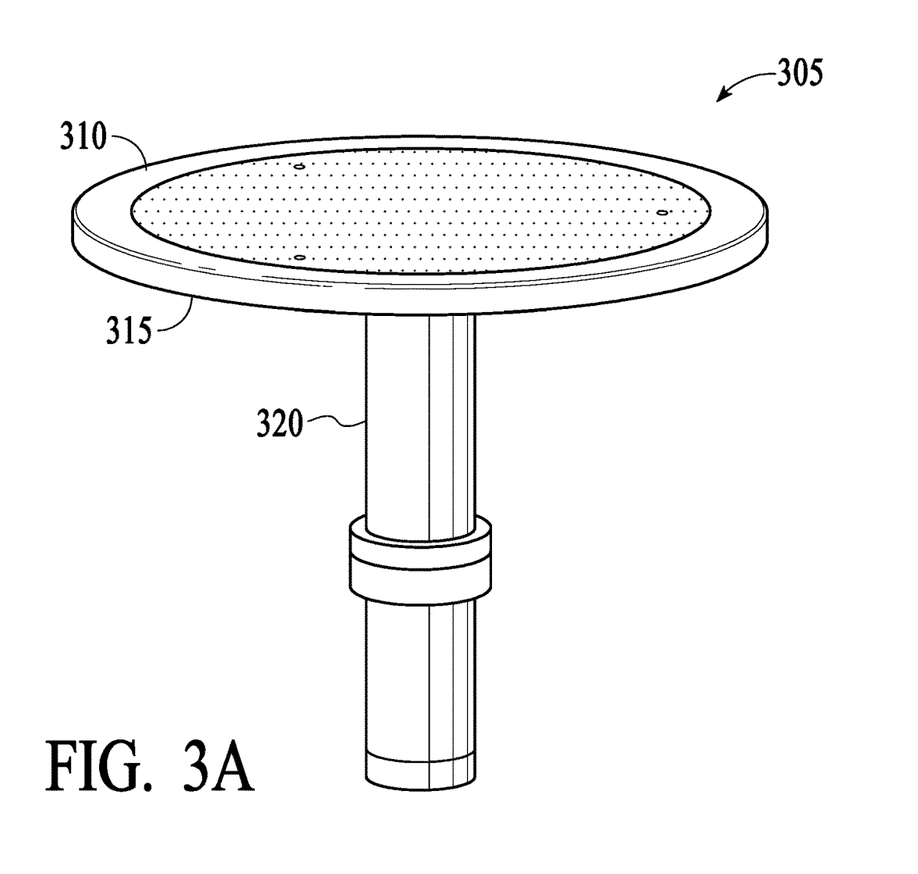
FIGS. 3A-B illustrate a heater substrate assembly in accordance with embodiments.
Figure 3B:
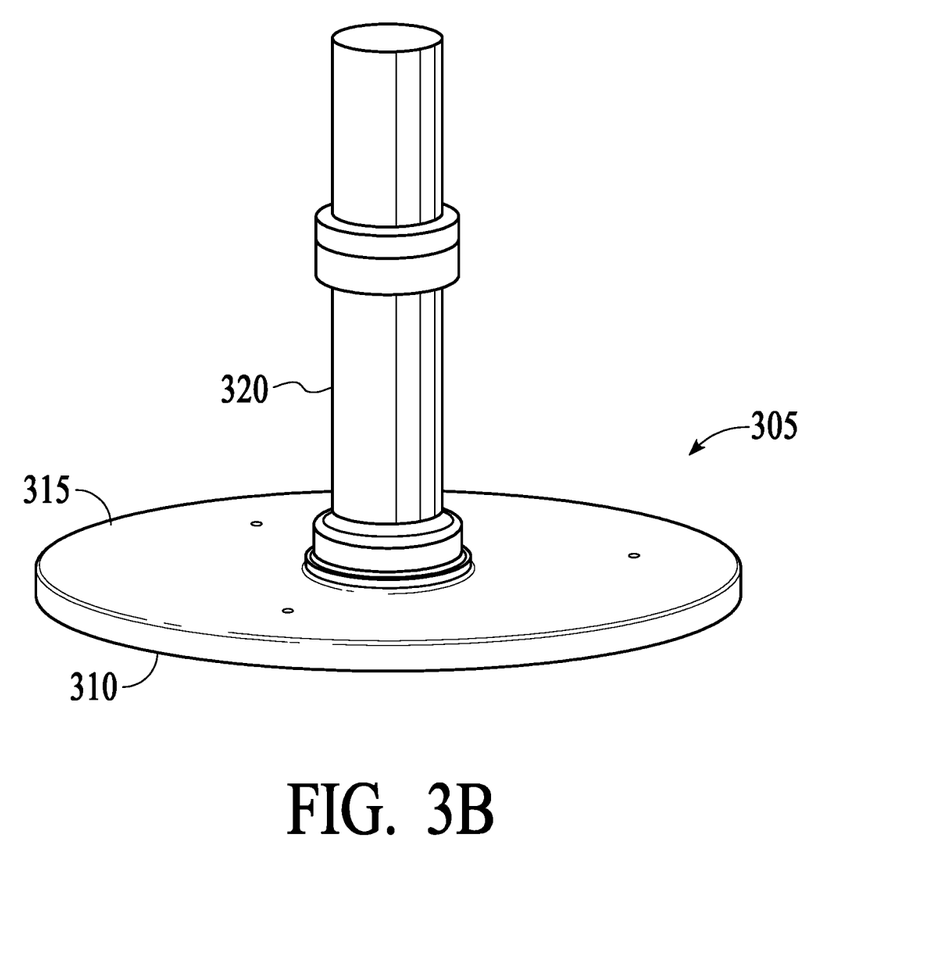

FIGS. 3A-B illustrate a heater assembly 305 in accordance with embodiments. The heater assembly 305 may be used as an alternative substrate support assembly to the ESC 148 in some embodiments. The heater assembly 305 includes a flat ceramic heater plate 310 that has one or more embedded heating elements (not shown). The ceramic heater plate 310 may have a thickness of 0.3-0.9 inches and a diameter of 7.9-14.8 inches in some embodiments. The ceramic heater plate 310 may include one or more mesas on an upper surface of the ceramic heater plate 310 in embodiments. The ceramic heater plate 310 may support a substrate during processing, and may be configured to heat the substrate to temperatures of up to about 650° C.

The ceramic heater plate 310 may be bonded to a funnel shaped body 320 that has a larger inner diameter and outer diameter at a top of the funnel shaped body 320 than at a bottom of the funnel shaped body 320. The bond between the ceramic heater plate 310 and the funnel shaped body 320 may be created by diffusion bonding at a temperature of over 1000° C. (e.g., up to 1800° C.) and a pressure of up to about 800 PSI (e.g., 300-800 PSI) in embodiments. The funnel shaped body 320 may be composed of AlN in embodiments, and may be hollow to minimize heat transfer between the ceramic heater plate 310 and other components of a chamber containing the ceramic heater plate 310. The AlN funnel shaped body 320 may include one or more dopants to control thermal conductivity. Examples of such dopants include samarium, yttrium and magnesium.

For the diffusion bond between the ceramic heater plate 310 and the funnel shaped body 320, an interface layer may be formed between the ceramic heater plate 310 and the funnel shaped body. The interface layer may be composed of Y, Zr, Al and O.

In some embodiments, the ceramic heater plate 310 is coupled to an additional ceramic heater plate 315. The additional ceramic heater plate 315 may be composed of AlN. In some embodiments, the ceramic heater plate 310 does not include heating elements, and the heating elements are instead included in the additional ceramic heater plate 315. The ceramic heater plate 310 may be coupled to the additional ceramic heater plate 315 by a diffusion bond or by bolts, for example.

The diffusion bond may be created using diffusion bonding at a temperature of over 1000° C. (e.g., up to 1800° C.) and a pressure of up to about 800 PSI (e.g., 300-800 PSI) in embodiments. The additional ceramic heater plate 315 may be bonded to the funnel shaped body 320 that has a larger inner diameter and outer diameter at a top of the funnel shaped body 320 than at a bottom of the funnel shaped body 320. The bond between the additional ceramic heater plate 315 and the funnel shaped body 320 may be created by diffusion bonding at a temperature of over 1000° C. (e.g., up to 1800° C.) and a pressure of up to about 800 PSI (e.g., 300-800 PSI) in embodiments. For the diffusion bond between the ceramic heater plate 310 and the additional ceramic heater plate 315, an interface layer may be formed between the ceramic heater plate 310 and the additional ceramic heater plate 315. The interface layer may be composed of Y, Zr, Al and O.

The ceramic heater 310 may be exposed to a fluorine-based plasma at a high temperature (e.g., up to about 650° C.). Fluorine may form on a surface of the ceramic heater 310 and react with any trace metals such as Al in the ceramic heater 310 (e.g., to form $AlF_3$). $AlF_3$ has a low vapor pressure, and may thus vaporize or sublime at the temperatures of up to about 650° C. The $AlF_3$ may then condense on other chamber components in the chamber, leading to particle contamination of processed substrates. Accordingly, a ceramic material of $Y_2O_3$—$ZrO_2$ that is very pure and that lacks Al or trace metals is used in embodiments to prevent fluoride buildup on chamber components. Since the ceramic heater 310 supports substrates (similarly to the electrostatic chuck 148), the composition for the ceramic material of $Y_2O_3$—$ZrO_2$ with 55-65 mol % $Y_2O_3$ and 35-45 mol % $ZrO_2$ is optimal or near optimal as it provides the highest hardness, flexural strength and fracture toughness and high plasma erosion resistance.

Figure 4A:
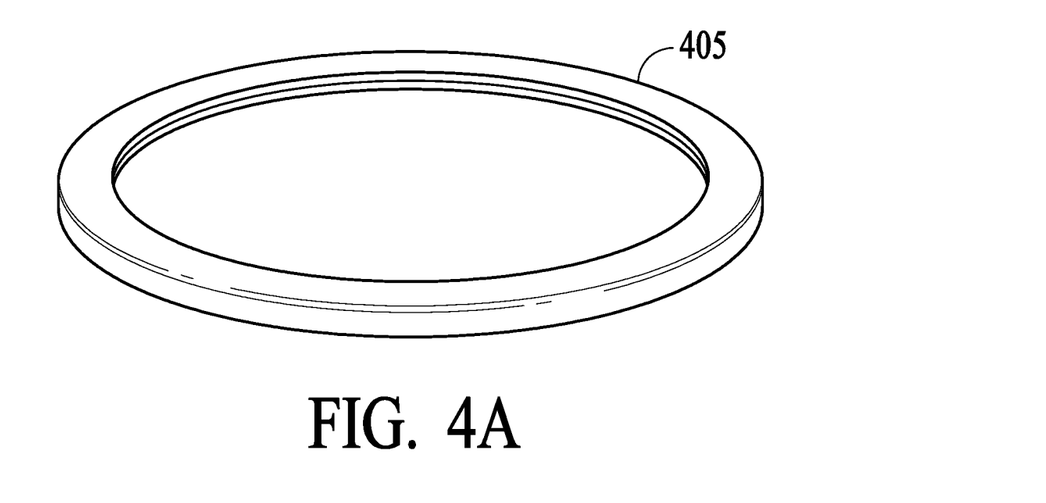
FIGS. 4A-B illustrate a top view and bottom view of a process kit ring, respectively, in accordance with embodiments.
Figure 4B:
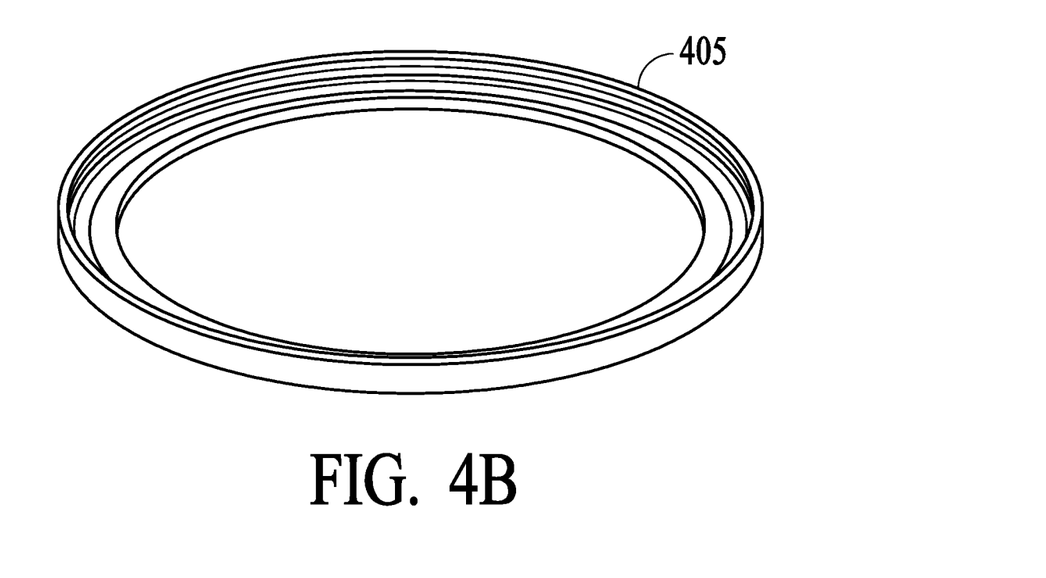

FIGS. 4A-B illustrate a top view and bottom view of a process kit ring 405, respectively, in accordance with embodiments. The process kit ring 405 may correspond to ring 134 in embodiments. The process kit ring 405 may have a thickness of about 0.5-1.5 inches, an inner diameter (ID) dimension of about 11-15 inches (e.g., about 11.8-14 inches) and an outer diameter (OD) dimension of about 12-16 inches in embodiments. An outer edge of the top of the process kit ring 405 may be rounded in embodiments. The width of the ring (difference between ID and OD) may be about 1-2.5 inches in embodiments. The process kit ring 405 may contact a supported substrate, and so may be subject to wear by such contact. Additionally, the process kit ring 405 has a relatively large diameter and is relatively thin and has a relatively small width. These factors may subject the process kit ring 405 to breakage during handling and/or use. Moreover, the process kit ring 405 may be exposed to plasma during processing. Accordingly, the process kit ring 405 benefits from the combination of plasma resistance, hardness, flexural strength and fracture toughness exhibited by the ceramic material of $Y_2O_3$—$ZrO_2$ with 55-65 mol % $Y_2O_3$ and 35-45 mol % $ZrO_2$ (e.g., ceramic materials of $Y_2O_3$—$ZrO_2$ that include about 60 mol % $Y_2O_3$ and about 40 mol % $ZrO_2$).

Figure 5A:
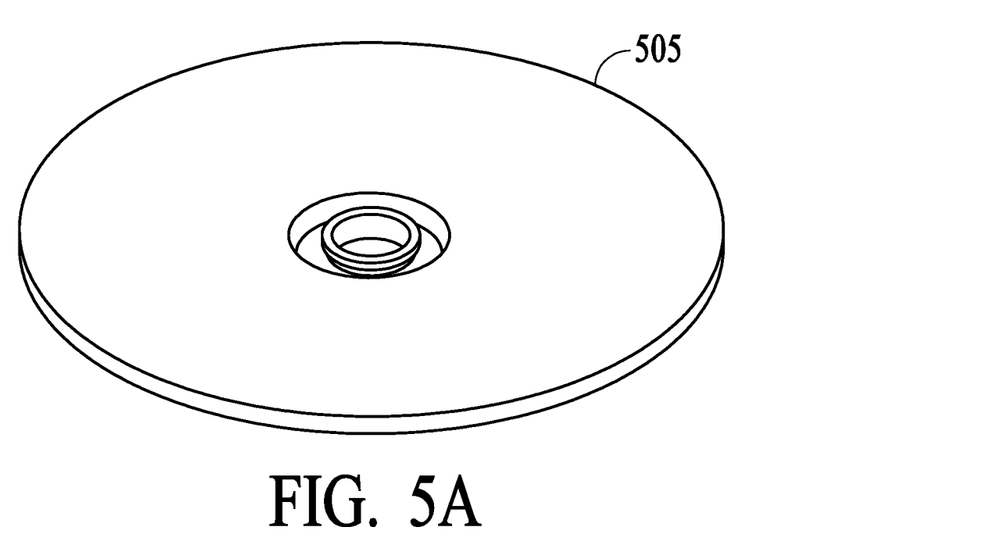
FIGS. 5A-B illustrate a top view and bottom view of a lid for a processing chamber, respectively, in accordance with embodiments.
Figure 5B:
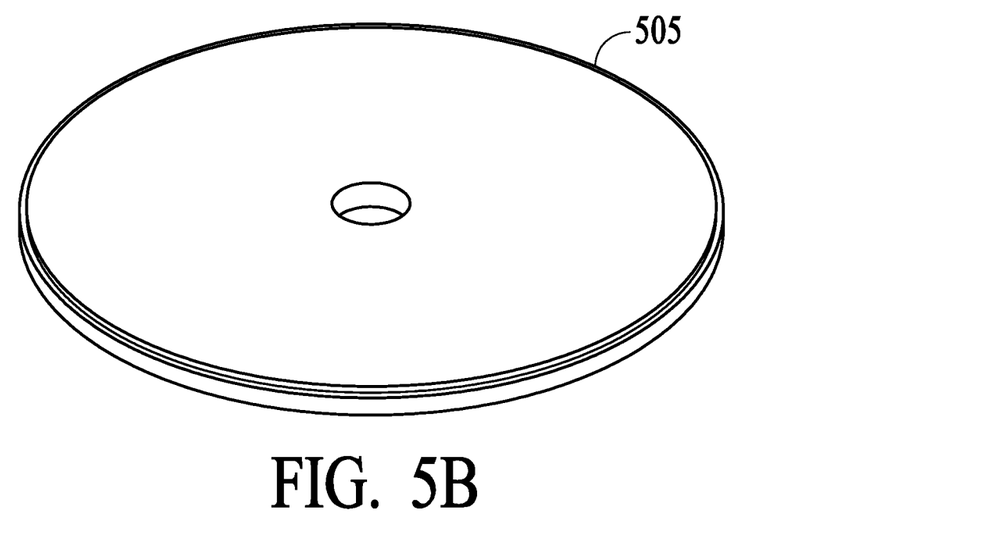

FIGS. 5A-B illustrate a top view and bottom view of a lid 505 for a processing chamber, respectively, in accordance with embodiments. The lid 505 may correspond to lid 132 in embodiments. The lid 505 may have a thickness of about 1-2 inches and a diameter of about 19-23 inches in embodiments. The lid 505 may contact other chamber components that may have a different coefficient of thermal expansion, and so may be subject to wear by such contact. Additionally, the lid 505 has a relatively large diameter and is relatively thin. These factors may subject the lid 505 to breakage during handling and/or use. Moreover, the lid 505 may be exposed to plasma during processing. Accordingly, the lid 505 benefits from the combination of plasma resistance, hardness, flexural strength and fracture toughness exhibited by the ceramic material of $Y_2O_3$—$ZrO_2$ with 55-65 mol % $Y_2O_3$ and 35-45 mol % $ZrO_2$ (e.g., ceramic materials of $Y_2O_3$—$ZrO_2$ that include about 60 mol % $Y_2O_3$ and about 40 mol % $ZrO_2$).

Figure 6A:
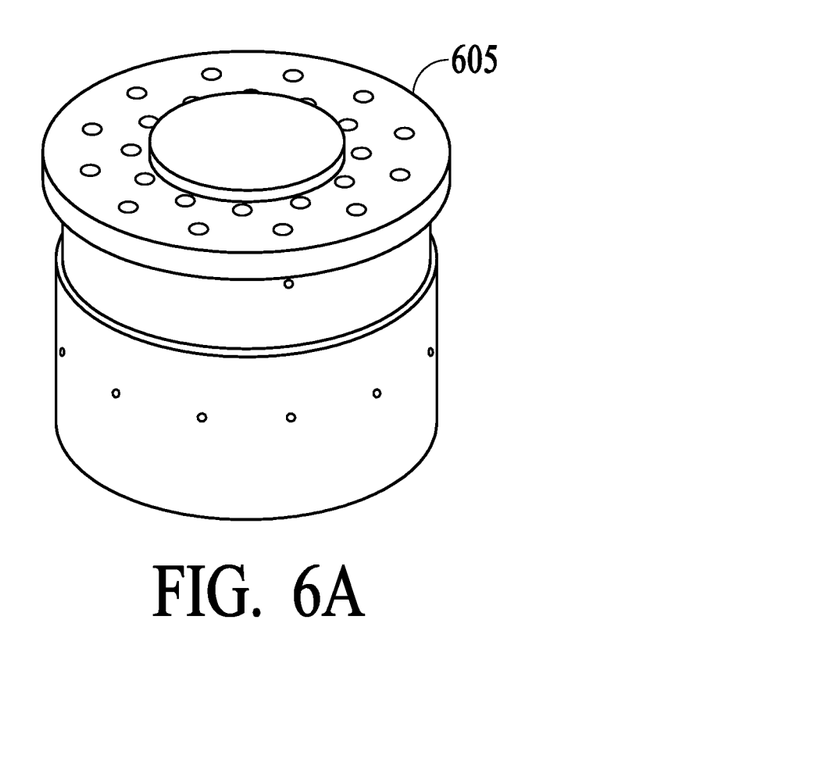
FIGS. 6A-B illustrate a top view and bottom view of a nozzle for a processing chamber, respectively, in accordance with embodiments.
Figure 6B:
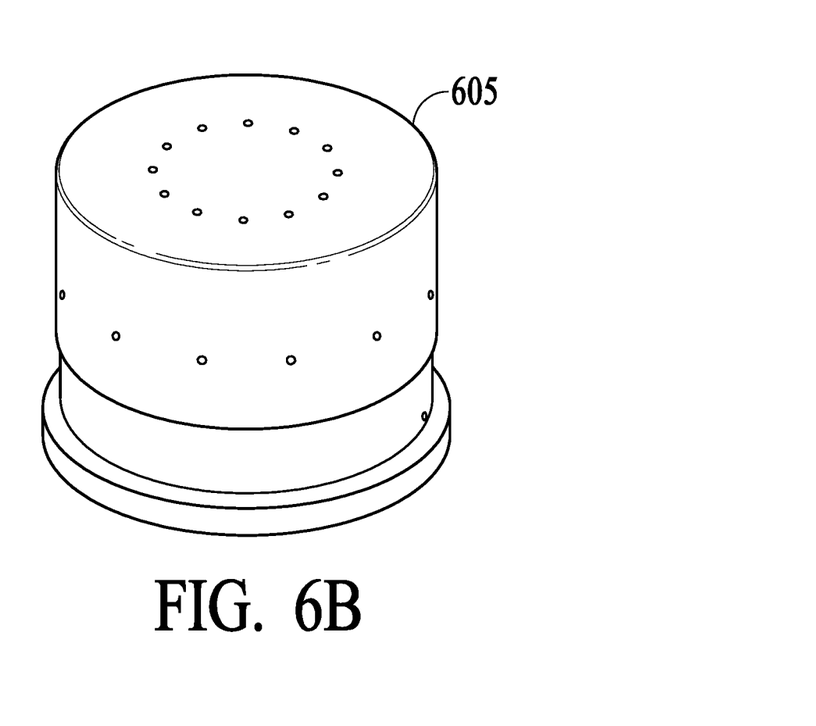

FIGS. 6A-B illustrate a top view and bottom view of a nozzle 605 for a processing chamber, respectively, in accordance with embodiments. The nozzle 605 may correspond to nozzle 152 in embodiments. The nozzle 605 may include multiple gas delivery holes. The nozzle 605 may fit into a hole at or near a center of the lid 505.

Figure 7A:
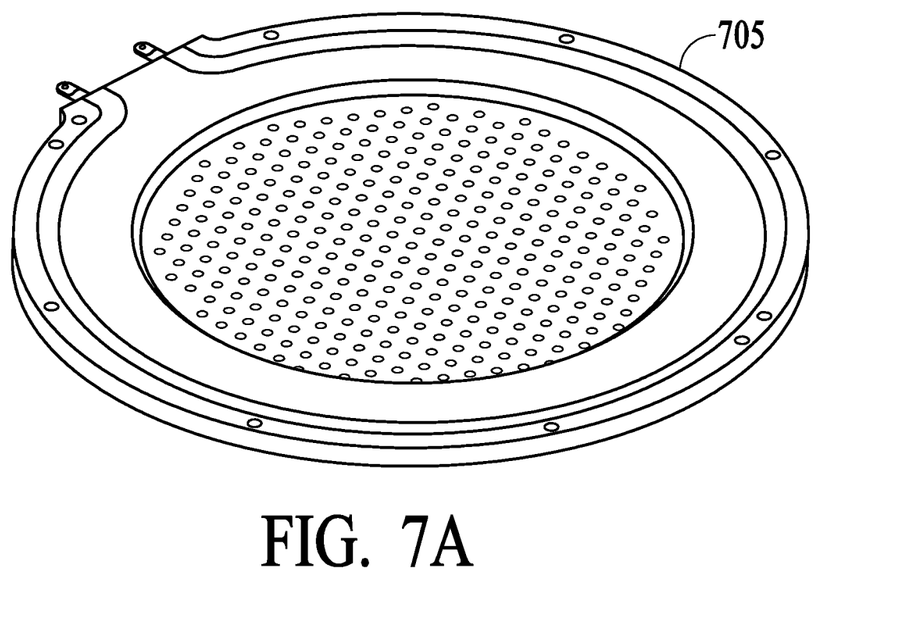
FIGS. 7A-B illustrate a top view and bottom view of a GDP for a processing chamber, respectively, in accordance with embodiments.
Figure 7B:
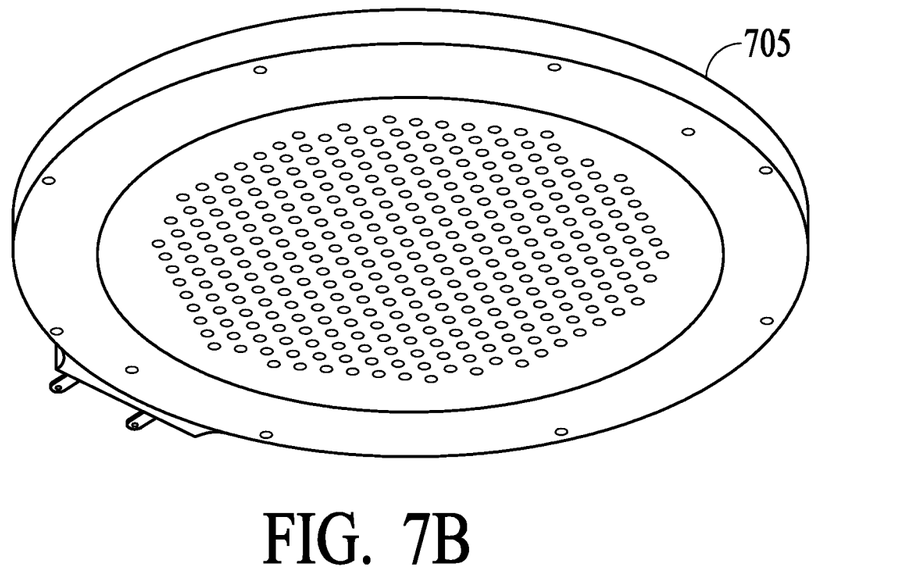

In some embodiments a chamber may include a gas delivery plate (GDP) rather than a lid and nozzle. FIGS. 7A-B illustrate a top view and bottom view of a GDP 705 for a processing chamber, respectively, in accordance with embodiments. The GDP 705 may include a large number (e.g., thousands) of gas delivery holes. The GDP 705 may have a thickness of about 1 mm (e.g., 0.04) to about 1 inch and a diameter of about 18-22 inches in embodiments. In one embodiment, the GDP 705 has a thickness of about 1-6 mm. The GDP 705 may be a load bearing component, and may have a relatively large diameter and be relatively thin. These factors may subject the GDP 705 to breakage during handling and/or use. Moreover, the GDP 705 may be exposed to plasma during processing. Accordingly, the GDP 705 benefits from the combination of plasma resistance, hardness, flexural strength and fracture toughness exhibited by the ceramic material of $Y_2O_3$—$ZrO_2$ with 55-65 mol % $Y_2O_3$ and 35-45 mol % $ZrO_2$ (e.g., ceramic materials of $Y_2O_3$—$ZrO_2$ that include about 60 mol % $Y_2O_3$ and about 40 mol % $ZrO_2$). The beneficial dielectric breakdown resistance of the ceramic material of $Y_2O_3$—$ZrO_2$ with 55-65 mol % $Y_2O_3$ and 35-45 mol % $ZrO_2$ (e.g., ceramic materials of $Y_2O_3$—$ZrO_2$ that include about 60 mol % $Y_2O_3$ and about 40 mol % $ZrO_2$) may also reduce arcing when used for the GDP 705. In some embodiments, the GDP 705 is connected to a backing plate (e.g., a metal backing plate such as an Al backing plate) for added mechanical strength. The GDP 705 may be mechanically clamped to the backing plate or bonded to the backing plate (e.g., by a diffusion bond).

Figure 8:
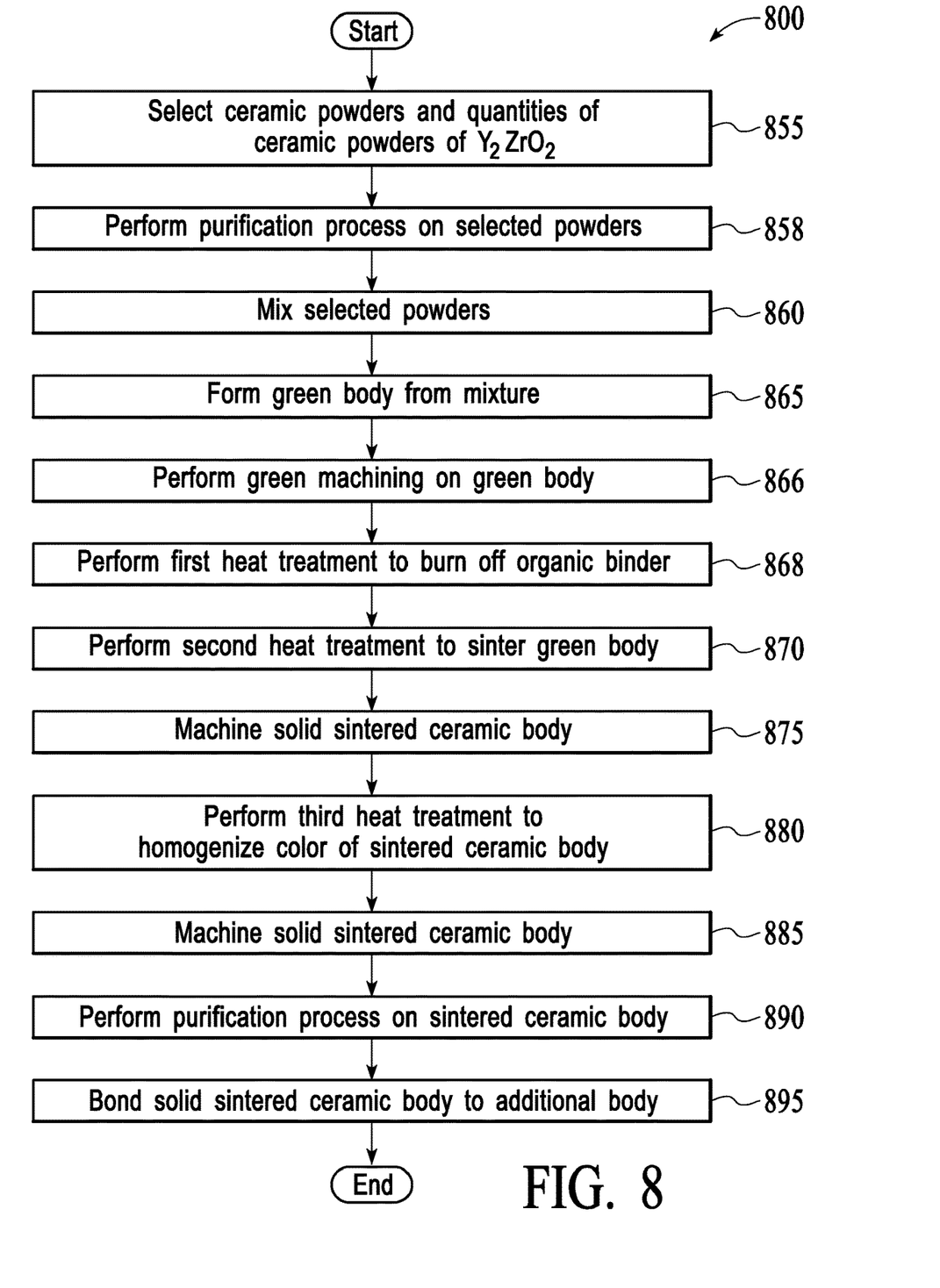
FIG. 8 is a flow chart showing a process for manufacturing a solid sintered ceramic article, in accordance with one embodiment of the present disclosure.

FIG. 8 is a flow chart showing a process 800 for manufacturing a solid sintered ceramic article, in accordance with one embodiment of the present disclosure. At block 855, ceramic powders of $Y_2O_3$ and $ZrO_2$ that are to be used to form the ceramic article are selected. Quantities of the selected ceramic powders are also selected. The ceramic powder of $Y_2O_3$ may have a purity of at least 99.99% and the ceramic powder of $ZrO_2$ may have a purity of at least 99.8% in embodiments.

At block 858, a purification process may be performed on the selected powders.

At block 860, the selected ceramic powders are mixed. In one embodiment, the selected ceramic powders are mixed with water, a binder and a deflocculant to form a slurry. In one embodiment, the ceramic powders are mixed using a milling process, such as ball milling. The mixing may cause the ceramic particles to agglomerate into agglomerates having a target particle size and a target size distribution. Notably, the mixture of ceramic powders does not include any added sintering agents in embodiments. In one embodiment, the ceramic powders are combined into a granular powder by spray drying. The spray drying process may volatize a liquid or solvent in the agglomerates.

At block 865, a green body (an unsintered ceramic article) is formed from the mixed powders (e.g., from the slurry formed from a mixture of the selected ceramic powders). The green body can be formed using techniques including, but not limited to, slip casting, tape casting, cold isostatic pressing, unidirectional mechanical pressing, injection molding, and extrusion. For example, the slurry may be spray dried, placed into a mold, and pressed to form the green body in one embodiment. In one embodiment, the green body is formed by cold isostatic pressing. The green body may have an approximate shape of a chamber component to be manufactured.

In one embodiment, at block 866 green machining may be performed on the green body. The green machining may include, for example, drilling holes in the green body.

At block 868, a first heat treatment is performed on the green body to burn off an organic binder in the green body. In one embodiment, the first heat treatment is performed by exposing the green body to an elevated heat of about 950° C. for a duration of about 1-2 weeks.

At block 870, a second heat treatment is performed on the green body to sinter the green body and produce a sintered ceramic body consisting essentially of 55-65 mol % $Y_2O_3$ and 35-45 mol % $ZrO_2$, (e.g., consisting essentially of about 60 mol % $Y_2O_3$ and about 40 mol % $ZrO_2$). Sintering the green body may include heating the green body to a high temperature that is below the melting point of $Y_2O_3$ and $ZrO_2$. The second heat treatment process may be performed at a temperature of about 1750-1900° C. for a duration of about 3-30 hours in embodiments. In embodiments, the sintering may be performed in the presence of air, oxygen and/or hydrogen (e.g., by flowing any of these gases into a furnace that is heating the green body). The sintering process densifies the green body and produces a solid sintered ceramic article having a porosity of about 0.1% that includes at least one $Y_2O_3$—$ZrO_2$ phase (e.g., a $Y_2O_3$—$ZrO_2$ solid solution). The sintering process may be a pressureless sintering process in embodiments.

In various embodiments, the solid sintered ceramic article may be used for different chamber components of a plasma etch reactor or other chamber. Depending on the particular chamber component that is being produced, the green body may have different shapes. For example, if the ultimate chamber component is to be a process kit ring, then the green body may be in the shape of a ring. If the chamber component is to be an electrostatic puck for an electrostatic chuck, then the green body may be in the shape of a disc. The green body may also have other shapes depending on the chamber component that is to be produced.

The sintering process typically changes the size of the ceramic article by an uncontrolled amount. Due at least in part to this change in size, the ceramic article is typically machined after the sintering process is completed at block 875. The machining may include surface grinding and/or polishing the ceramic article, drilling holes in the ceramic article, cutting and/or shaping the ceramic article, grinding the ceramic article, polishing the ceramic article (e.g., using chemical mechanical planarization (CMP), flame polishing, or other polishing techniques), roughening the ceramic article (e.g., by bead blasting), forming mesas on the ceramic article, and so forth.

After sintering, the sintered ceramic body may have color non-uniformities. The color non-uniformities may be defects that cause chamber components formed from the sintered ceramic body to be returned by customers. Accordingly, in one embodiment at block 880 a third heat treatment is performed on the sintered ceramic body to homogenize a color of the sintered ceramic body. In embodiments, the sintered ceramic body has a uniform white color after the third heat treatment. The third heat treatment may be performed at a temperature of about 1000-1400° C. for a duration of 2-12 hours.

In one embodiment, the machining processes of blocks 866 and/or 875 are rough machining processes that cause the sintered ceramic body to roughly have a target shape and features. In one embodiment, at block 885 the solid sintered ceramic body is again machined using an additional machining process. The additional machining process may be a fine machining process that causes the sintered ceramic body to have a target shape, roughness and/or features. The ceramic article may be machined into a configuration that is appropriate for a particular application. Prior to machining, the ceramic article may have a rough shape and size appropriate for a particular purpose (e.g., to be used as a lid in a plasma etcher). However, the machining may be performed to precisely control size, shape, dimensions, hole sizes, and so forth of the chamber component.

The machining processes of blocks 866, 875 and/or 885 may introduce trace metal impurities to the sintered ceramic article. Additionally, the sintered ceramic article may include a very low amount of trace metal impurities introduced by the original ceramic powders and/or other manufacturing steps. For chamber components that will be exposed to fluorine based plasmas, even a very small amount of metal impurities may be detrimental to processed substrates. Accordingly, at block 890 a final purification process may be performed on the sintered ceramic body. After purification, metal contaminants may be removed such that there are no metal contaminants with a value of 100 parts per million (ppm) or higher in the ceramic body. Accordingly, an overall purity of the ceramic body after the purification process may be 99.9%. In one embodiment, the final purification process includes a wet clean process and/or a dry clean process. The final purification process may remove trace metal contaminants from a surface of the sintered ceramic body in embodiments. In other embodiments, the final purification process may remove trace metal contaminants from the inside of the ceramic body as well as a surface of the ceramic body.

Table 2 below provides metal impurities for ceramic bodies manufactured in accordance with method 800. The metal impurities were measured by GDMS analysis and are expressed in terms of parts per million (ppm) by weight (wt.).

TABLE 2

| Metal Impurities | |
| --- | --- |
| Metal | Impurity |
| Al | ≤30 |
| B | ≤20 |
| Ca | ≤50 |
| Cr | ≤10 |
| Co | ≤10 |
| Cu | ≤10 |
| Fe | ≤50 |
| Pb | ≤20 |
| Li | ≤20 |
| Mg | ≤20 |
| Mn | ≤10 |
| Ni | ≤10 |
| K | ≤10 |
| Na | ≤50 |
| Sn | ≤50 |
| Zn | ≤20 |

Depending on the particular chamber component that is to be produced, additional processing operations may additionally be performed. In one embodiment, the additional processing operations include bonding the solid sintered ceramic body to a metal body or other body (block 895). In some instances, in which the solid sintered ceramic body is both machined and bonded to a metal body, the machining may be performed first, followed by the bonding. In other instances, the solid sintered ceramic article may first be bonded to a metal body, and may then be machined. In other embodiments, some machining is performed both before and after the bonding. Additionally, in some embodiments the solid sintered ceramic article may be bonded to another ceramic article.

In a first example, the ceramic article is to be used for a showerhead or GDP. In such an embodiment, many holes may be drilled into the ceramic article, and the ceramic article may be bonded to an aluminum gas distribution plate. In a second example, the ceramic article is used for an electrostatic chuck. In such an embodiment, helium pin holes are drilled into the ceramic article (e.g., by laser drilling), and the ceramic article may be bonded by a silicone bond or diffusion bond to an aluminum base plate. In another example, the ceramic article is a ceramic lid. Since the ceramic lid has a large surface area, the ceramic lid formed from the new sintered ceramic material may have a high structural strength to prevent cracking or buckling during processing (e.g., when a vacuum is applied to a process chamber of the plasma etch reactor). In other examples, a nozzle, a process kit ring, or other chamber component is formed.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A chamber component for a processing chamber, comprising:
   a ceramic body consisting of a sintered ceramic material consisting essentially of one or more phase of $Y_2O_3$—$ZrO_2$, wherein the sintered ceramic material consists essentially of 55-65 mol % $Y_2O_3$ and 35-45 mol % $ZrO_2$, and wherein the sintered ceramic material has a purity of over 99.9%.

2. The chamber component of claim 1, wherein the sintered ceramic material consists essentially of 57-63 mol % $Y_2O_3$ and 37-43 mol % $ZrO_2$.

3. The chamber component of claim 1, wherein the sintered ceramic material consists essentially of 58-62 mol % $Y_2O_3$ and 38-42 mol % $ZrO_2$.

4. The chamber component of claim 1, wherein the chamber component is a nozzle that consists of the ceramic body, the nozzle comprising a plurality of through gas delivery holes.

5. The chamber component of claim 1, wherein the chamber component is a curved door to the processing chamber, the ceramic body having a thickness of about 0.5-1.5 inches, a length of about 3-6 inches and a height of about 10-14 inches.

6. The chamber component of claim 1, wherein the chamber component is a lid consisting of the ceramic body, the ceramic body having a thickness of about 1-2 inches and a diameter of about 19-23 inches.

7. The chamber component of claim 1, wherein the chamber component is an electrostatic chuck, and wherein the ceramic body is a puck for the electrostatic chuck, the chamber component further comprising:
   a thermally conductive base bonded to a lower surface of the ceramic body, the thermally conductive base consisting essentially of Al, wherein a side wall of the thermally conductive base comprises an anodization layer of $Al_2O_3$.

8. The chamber component of claim 1, wherein the chamber component is a heater configured to support and heat a wafer, and wherein the ceramic body is a flat ceramic heater plate, the chamber component further comprising:
   a funnel shaped shaft bonded to the flat ceramic heater plate.

9. The chamber component of claim 1, wherein the chamber component comprises a load bearing gas delivery plate having a thickness of about 1 inch and a diameter of about 20-22 inches.

10. The chamber component of claim 1, wherein the chamber component is a ring having a thickness of about 1-2.5 inches, an inner dimension diameter of about 11-15 inches, and an outer dimension diameter of about 12-16 inches.

11. The chamber component of claim 1, wherein the sintered ceramic material further has a Vicker Hardness of about 9.1-9.4 GPa.

12. The chamber component of claim 1, wherein the sintered ceramic material further has a thermal expansion coefficient of about 9.4-9.6.

13. The chamber component of claim 1, wherein the sintered ceramic material further has a dielectric breakdown resistance of about 500-600 V/mil.

14. The chamber component of claim 1, wherein the sintered ceramic material further has an average flexural strength of about 139.4-150 MPa.

15. An electrostatic chuck for a processing chamber, comprising:
   a puck, wherein the puck is a ceramic body consisting of a sintered ceramic material consisting essentially of one or more phase of $Y_2O_3$—$ZrO_2$, wherein the sintered ceramic material consists essentially of 55-65 mol % $Y_2O_3$ and 35-45 mol % $ZrO_2$; and
   a thermally conductive base bonded to a lower surface of the puck, the thermally conductive base consisting essentially of Al, wherein a side wall of the thermally conductive base comprises an anodization layer of $Al_2O_3$.

16. The electrostatic chuck of claim 15, wherein the sintered ceramic material has:
   a Vicker Hardness of about 9.1-9.4 GPa; or a thermal expansion coefficient of about 9.4-9.6; or a dielectric breakdown resistance of about 500-600 V/mil; or an average flexural strength of about 139.4-150 MPa.

17. The electrostatic chuck of claim 15, wherein the sintered ceramic material consists essentially of: a) 57-63 mol % $Y_2O_3$ and 37-43 mol % $ZrO_2$ or b) 58-62 mol % $Y_2O_3$ and 38-42 mol % $ZrO_2$.

18. A heater for a processing chamber, the heater configured to support and heat a wafer, the heater comprising:

a flat ceramic heater plate, wherein the flat ceramic heater plate is a ceramic body consisting of a sintered ceramic material consisting essentially of one or more phase of $Y_2O_3$—$ZrO_2$, wherein the sintered ceramic material consists essentially of 55-65 mol % $Y_2O_3$ and 35-45 mol % $ZrO_2$; and a funnel shaped shaft bonded to the flat ceramic heater plate.

19. The heater electrostatic chuck of claim 18, wherein the sintered ceramic material has:

a Vicker Hardness of about 9.1-9.4 GPa; or a thermal expansion coefficient of about 9.4-9.6; or a dielectric breakdown resistance of about 500-600 V/mil; or an average flexural strength of about 139.4-150 MPa.

* * * * *

UNITED STATES PATENT AND TRADEMARK OFFICE
CERTIFICATE OF CORRECTION

PATENT NO. : 11,014,853 B2
APPLICATION NO. : 16/279247
DATED : May 25, 2021
INVENTOR(S) : Jennifer Y. Sun and David Fenwick Page 1 of 1

It is certified that error appears in the above-identified patent and that said Letters Patent is hereby corrected as shown below:

In the Claims

In Claim 19, Column 15, Line 19, delete "electrostatic chuck"

Signed and Sealed this
Fourteenth Day of December, 2021

Drew Hirshfeld
*Performing the Functions and Duties of the*
*Under Secretary of Commerce for Intellectual Property and*
*Director of the United States Patent and Trademark Office*